(12) United States Patent
Sudijono et al.

(10) Patent No.: US 6,391,783 B1
(45) Date of Patent: May 21, 2002

(54) METHOD TO THIN DOWN COPPER BARRIERS IN DEEP SUBMICRON GEOMETRIES BY USING ALKALINE EARTH ELEMENT, BARRIER ADDITIVES, OR SELF ASSEMBLY TECHNIQUE

(75) Inventors: John Sudijono; Yakub Aliyu; Mei Sheng Zhou; Simon Chooi; Subhash Gupta; Sudipto Roy; Paul Ho; Yi Xu, all of Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 47 days.

(21) Appl. No.: 09/615,811

(22) Filed: Jul. 13, 2000

(51) Int. Cl.[7] .................. H01L 21/31; H01L 21/469
(52) U.S. Cl. .................. 438/700; 438/703; 438/758
(58) Field of Search .................. 438/700, 703, 438/758

(56) References Cited

U.S. PATENT DOCUMENTS 4,797,371 A * 1/1989 Kuroda .................. 438/91
5,605,858 A * 2/1997 Nishioka et al. .................. 438/2
5,696,018 A * 12/1997 Summerfelt et al. .................. 438/240
5,747,360 A 5/1998 Nulman .................. 437/189
5,821,168 A 10/1998 Jain .................. 438/692
5,876,798 A 3/1999 Vassiliev .................. 427/255.3

* cited by examiner

Primary Examiner—Benjamin L. Utech
Assistant Examiner—Lynette T. Umez-Eronini
(74) Attorney, Agent, or Firm—George O. Saile; Rosemary L.S. Pike; Stephen G. Stanton

(57) ABSTRACT

A method of forming a metal plug, comprising the following steps. An etched dielectric layer, over a conductive layer, over a semiconductor structure are provided. The etched dielectric layer having a via hole and an exposed periphery. The etched dielectric layer is treated with at least one alkaline earth element source to form an in-situ metal barrier layer within the dielectric layer exposed periphery. A metal plug is formed within the via hole wherein the in-situ metal barrier layer prevents diffusion of the metal from the metal plug into the dielectric oxide layer.

22 Claims, 1 Drawing Sheet

METHOD TO THIN DOWN COPPER BARRIERS IN DEEP SUBMICRON GEOMETRIES BY USING ALKALINE EARTH ELEMENT, BARRIER ADDITIVES, OR SELF ASSEMBLY TECHNIQUE

FIELD OF THE INVENTION

The present invention relates generally to fabrication of semiconductor devices used in integrated circuits, and specifically to a method of forming an in-situ copper barriers in deep sub-micron geometries.

BACKGROUND OF THE INVENTION

Existing, ex-situ barriers will be difficult to implement as the geometries shrink and aspect ratios continue to increase. Insufficient step coverage will lead to poor barrier properties and results in integration problems, especially in the presence of copper (Cu).

U.S. Pat. No. 5,821,168 to Jain describes a process for forming a semiconductor device by nitriding an insulating layer then covering it with a thin adhesion layer to form a diffusion barrier film. An adhesion layer, that may include magnesium, titanium or the like, is formed over the diffusion barrier layer. A composite copper layer is then deposited within a via opening in the adhesion layer coated insulating layer and planarized to form a dual inlaid structure, for example. The process does not require a separate diffusion barrier due to the formation of the diffusion barrier layer from a portion of the insulating layer. The adhesion layer provides a strong adhesion between the composite copper and the nitrided oxide portions.

U.S. Pat. No. 5,747,360 to Nulman describes a method for metallizing semiconductor materials that includes two processing steps. The first step involves depositing an alloy layer on the semiconductor surface in a single step from a single source. The layer may be an alloy of conductive metal, such as aluminum, and an Alloy Material such as hafnium, tantalum, magnesium, germanium, silicon, titanium, titanium nitride, tungsten and/or a composite of tungsten. The second step, a layer of the conductive metal, such as aluminum, is deposited over the alloy layer.

U.S. Pat. No. 5,876,798 to Vassiliev describes a method of forming high quality films of fluorinated silicon oxide suitable for use a intermetal dielectrics by tight control over the deposition conditions by means of CVD (chemical vapor deposition) at reduced pressure using fluorotriethoxysilane (FTES) and tetra-exthyloxysilane (TEOS) as precursors together with ozone (mixed with oxygen). In a second embodiment, TEOS is omitted and only FTES is used.

SUMMARY OF THE INVENTION

Accordingly, it is an object of the present invention to eliminate the need for an ex-situ copper barrier layer.

A further object of the present invention is fabricate an in-situ copper barrier layer that inhibits copper diffusion.

Other objects will appear hereinafter.

It has now been discovered that the above and other objects of the present invention may be accomplished in the following manner. Specifically, an etched dielectric layer, over a conductive layer, over a semiconductor structure are provided. The etched dielectric layer is preferably comprised of FSG and has a via hole and an exposed periphery. The etched dielectric layer is treated with at least one alkaline earth element source, preferably $Ca(HCO_3)_2$, and RMgBr and RMgCl Grignard reagents to form an in-situ metal barrier layer within the dielectric layer exposed periphery. A metal plug, preferably comprised of copper, is formed within the via hole wherein the in-situ metal barrier layer prevents diffusion of the metal from the metal plug into the dielectric oxide layer.

Briefly, as an example method in accordance with the present invention:

I. Deposit FSG layer 14 by PECVD or HDP process;
II. Etch via hole 16 in FSG layer 14;
III. Treat etched FSG layer 14 with aqueous
 1. $Ca(HCO_3)_2$ (source of Ca); and/or
 2. Grignard reagent (RMgBr and/or RMgCl) (source of Mg) to diffuse Ca and/or Mg into FSG layer 14 forming in-situ copper barrier layer 18;
IV. (Optional Step) Treat structure with hydrogen plasma to remove Br and/or Cl (from Grignard reagent); and
V. Deposit copper in via hole with in-situ copper barrier layer 18 and planarizing to form copper plug 20.

BRIEF DESCRIPTION OF THE DRAWINGS

The features and advantages of the present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENT

Figure 1:
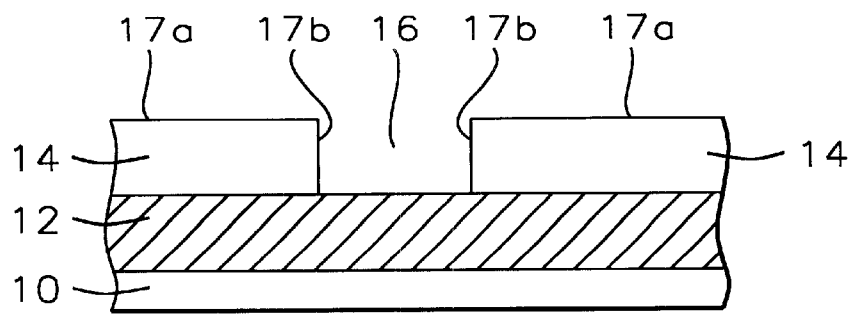
FIGS. 1 to 3 schematically illustrate in cross-sectional representation a preferred embodiment of the present invention.

Accordingly FIG. 1 shows a schematic cross-sectional diagram of semiconductor structure 10 that is understood to possibly include a semiconductor wafer or substrate, active and passive devices formed within the wafer, conductive layers and dielectric layers (e.g., inter-poly oxide (IPO), intermetal dielectric (IMD), etc.) formed over the wafer surface.

The term "semiconductor structure" is meant to include devices formed within a semiconductor wafer and the layers overlying the wafer.

Unless otherwise specified, all structures, layers, etc. may be formed or accomplished by conventional methods known in the prior art.

Conductive layer 12 is formed over semiconductor structure 10 and may have a thickness from about 2000 to 10,000 Å. Conductive layer 12 may be comprised of copper, aluminum, silver, or gold and is preferably copper. For purposes of illustration, conductive layer 12 will be considered to be comprised of copper hereafter.

FIG. 1: Formation Dielectric Layer 14

Dielectric oxide layer 14 is formed over conductive layer 12 to a thickness of from about 2000 to 10,000 Å, and more preferably from about 4000 to 8000 Å. Dielectric layer 14 may be comprised of fluorosilicate glass (FSG), phosphosilicate glass (PSG), borophosphosilicate glass (BFSG), or carbon-doped oxide, and is preferably FSG. For purposes of illustration, dielectric layer 14 will be considered to be comprised of FSG hereafter.

In one key step of the invention, FSG layer 14 may be formed through the use of $SiF_4$, $CF_4$, or $NF_3$ as the source of fluorine (F) by the use of plasma enhanced chemical vapor deposition (PECVD) or high density plasma (HDP) processes. This simultaneous doping of fluorine into oxide to form FSG layer 14 reduces the degradation of the k-values (dielectric values).

FIG. 1: Formation of Via Hole 16 Within Dielectric Layer 14

FSG layer 14 is patterned and etched to form via hole 16 exposing conductive layer 12. Via hole 16 is from about 100 to 10,000 Å wide, and is more preferably from about 1000 to 5000 Å wide.

FSG layer 14 has an exposed periphery 17a, 17b consisting of horizontal portions 17a and vertical portions 17b within via hole 16.

Figure 2:
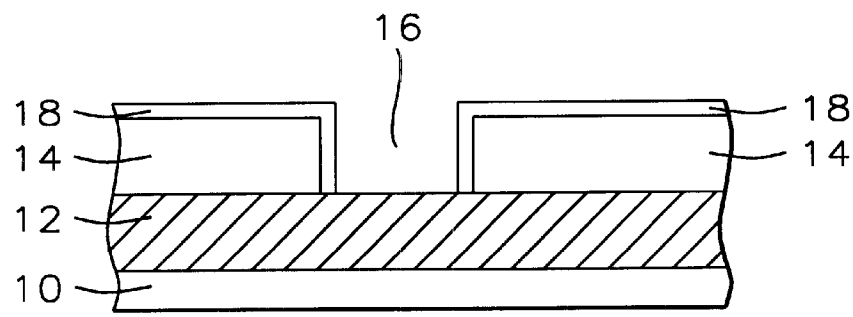

FIG. 2: Formation of In-situ Copper Barrier Layer 18

In a key step of the invention, as shown in FIG. 2, the structure is subjected to a surface treatment using Alkaline Earth elements to form an in-situ copper barrier layer 18.

The Alkaline Earth elements can comprise i.e. beryllium (Be), magnesium (Mg), calcium (Ca), strontium (Sr), barium (Ba), or radium (Ra) and more preferably Ca and/or Mg. For purposes of illustration, the Alkaline Earth elements will be considered to be Ca and/or Mg hereafter.

Specifically, for a Ca and/or Mg Alkaline Earth element surface treatment, the structure is treated with:

(1) $Ca(HCO_3)_2$ or $Mg(HCO_3)_2$, and more preferably aqueous $Ca(HCO_3)_2$—the source of the calcium (Ca); and/or (2) a Grignard reagent in an organic solvent [i.e. RMgX where "R"=alkyl group and "X"=a halide, i.e. fluorine (F), chlorine (Cl), bromine (Br), iodine (I), or astatine (At)]—the source of the magnesium (Mg); the organic solvent may be diethyl ether for example i.e. roughly:

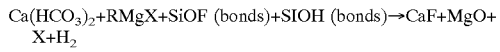

$Ca(HCO_3)_2 + RMgX + SiOF\ (bonds) + SiOH\ (bonds) \rightarrow CaF + MgO + X + H_2$ @ Temperature from about 100 to 600° C., and more preferably from about 300 to 450° C.;

@ Time from about 0.5 to 5 minutes, and more preferably from about 0.5 to 1 minutes;

During this surface treatment Ca and/or Mg diffuse through the periphery 17a, 17b of FSG dielectric layer 14 and into FSG layer 14 forming in-situ copper barrier layer 18. Ca and Mg have a greater diffusion length and thus move faster than copper in oxides, and so occupy the oxide lattice. As a result, copper diffusion (from the subsequently formed copper plugs 20—see FIG. 3) is inhibited as there are no bonding sites available in the oxide lattice (gradient concentration is prevented).

Formation of in-situ barrier layer 18 obviates the need for an ex-situ barrier layer that would provide poor step coverage in deep sub-micron geometries. The present invention permits smaller design rule structure and device formation.

In-situ copper barrier layer 18 has a depth from about 1 to 100 Å, and more preferably from about 2 to 30 Å.

FIG. 2: Optional Hydrogen-Plasma Treatment

Figure 3:
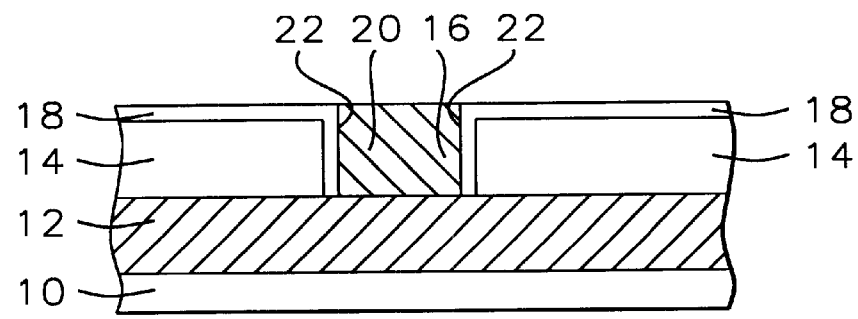

In an optional step, the structure may be treated with hydrogenplasma to remove Br and/or Cl from the Grignard reagent(s) at the following parameters:

Temperature: from about 100 to 250° C.;

Power: from about 200 to 3000 Watts;

Flow rate of hydrogen: from about 100 to 5000 sccm;

FIG. 3: Formation of Copper Plug 20 Within Via Hole 16

As shown in FIG. 3, a metal is then deposited over the in-situ copper barrier layer 18, filling via hole 16, and planarized to form metal plug 20, for example. Metal plug 20 may comprise copper, aluminum, gold, or silver, and is preferably copper. For purposes of illustration, metal plug 20 will be considered to be comprised of copper hereafter.

As referenced above, the diffusion of Ca and/or Mg into FSG layer 14 at its periphery 17a, 17b and into the FSG layer 14 lattice to form in-situ copper barrier layer 18, effectively eliminates bonding sites for copper from copper plug 20. Thus copper diffusion into FSG layer 14 is inhibited as there are no bonding sites available in the oxide lattice of dielectric oxide layer 14 (gradient concentration is prevented).

As noted above, the presence of fluorine in the oxides, i.e. formation of FSG layer 14, increases the possibility of forming $CaF_x$ compounds at the FSG layer 14—copper plug 20 interface 22. $CaF_x$ compounds are known to have a good passivation effect and thus further block diffusion of Cu into the oxides, i.e. FSG layer 14, for example. The also achieves a stronger interface 22 quality and lessens peeling.

Thus, the present invention eliminated the need for an ex-situ copper barrier and the k-values are maintained by counter-doping with fluorine into the oxides (i.e. formation of FSG layer 14), and a stronger interface quality is achieved with the formation of $CaF_x$ at the interface 22 between in-situ barrier layer 18 and copper plug 20.

While particular embodiments of the present invention have been illustrated and described, it is not intended to limit the invention, except as defined by the following claims.

We claim:

1. A method of forming a metal plug, comprising the steps of:

providing an etched dielectric layer over a conductive layer over a semiconductor structure; said etched dielectric layer having a via hole and an exposed periphery;

treating said etched dielectric layer with at least one Alkaline Earth element source to form an in-situ metal barrier layer within said dielectric layer exposed periphery; and forming a metal plug within said via hole.

2. The method of claim 1, wherein said in-situ metal barrier layer is from about 1 to 100 Å thick.

3. The method of claim 1, wherein said in-situ metal barrier layer is from about 2 to 30 Å thick.

4. The method of claim 1, wherein said etched dielectric layer is from about 2000 to 10,000 Å thick and said via hole 16 is from about 100 to 10,000 Å wide.

5. The method of claim 1, wherein said etched dielectric layer is from about 4000 to 8000 Å thick and said via hole is from about 1000 to 5000 Å wide.

6. The method of claim 1, wherein said dielectric layer is selected from the group consisting of FSG, PSG, BPSG, carbon-doped oxide; said conductive layer is formed of a material selected from the group consisting of copper, aluminum, gold, and silver; said at least one Alkaline Earth element source is selected from the group consisting of RMgBr, RMgCl, RMgF, RMgI and RMgAt Grignard reagents in an organic solvent, and a calcium source selected from the group consisting of aqueous $Ca(HCO_3)_2$ and aqueous $Mg(HCO_3)_2$; and said metal plug is comprised of a metal selected from the group consisting of copper, aluminum, gold, and silver.

7. The method of claim 1, wherein said at least one Alkaline Earth element source is aqueous $Ca(HCO_3)_2$, and a Grignard reagent in an organic solvent; said Grignard reagent selected from the group consisting of RMgBr and RMgCl, and includes the step of;

treating the structure after formation of said in-situ metal barrier layer and before formation of said metal plug with hydrogen-plasma whereby Br and Cl are removed from said structure.

8. The method of claim 1, wherein said dielectric layer is comprised of FSG; said conductive layer is comprised of copper; said at least one Alkaline Earth element source is aqueous Ca(HCO$_3$) and a mixture of RMgBr and RMgCl Grignard reagents in an organic solvent; and said metal plug is comprised of copper.

9. A method of forming a metal plug, comprising the steps of:
  providing an etched dielectric layer over a conductive layer over a semiconductor structure; said etched dielectric layer having a via hole and an exposed periphery; said etched dielectric layer being from about 2000 to 10,000 Å thick; said via hole being from about 100 to 10,000 Å wide;
  treating said etched dielectric layer with at least one Alkaline Earth element source to form an in-situ metal barrier layer within said dielectric layer exposed periphery; said in-situ metal barrier layer being from about 1 to 100 Å thick; and
  forming a metal plug within said via hole.

10. The method of claim 9, wherein said in-situ metal barrier layer is from about 2 to 30 Å thick.

11. The method of claim 9, wherein said etched dielectric layer is from about 4000 to 8000 Å thick and said via hole is from about 1000 to 5000 Å wide.

12. The method of claim 9, wherein said dielectric layer is selected from the group consisting of FSG, PSG, BPSG, and carbon-doped oxide; said conductive layer is formed of a material selected from the group consisting of copper, aluminum, gold, and silver; said at least one Alkaline Earth element source is selected from the group consisting of RMgBr, RMgCl, RMgF, RMgI and RMgAt Grignard reagents in an organic solvent, and a calcium source selected from the group consisting of aqueous Ca(HCO$_3$)$_2$ and aqueous Mg(HCO$_3$)$_2$; and said metal plug is comprised of a metal selected from the group consisting of copper, aluminum, gold, and silver.

13. The method of claim 9, wherein said at least one Alkaline Earth element source is aqueous Ca(HCO$_3$)$_2$, and a Grignard reagent in an organic solvent; said Grignard reagent selected from the group consisting of RMgBr and RMgCl, and includes the following step;
  treating the structure after formation of said in-situ metal barrier layer and before formation of said metal plug with hydrogen-plasma whereby Br and Cl are removed from said structure.

14. The method of claim 9, wherein said dielectric layer is comprised of FSG; said conductive layer is comprised of copper; said at least one Alkaline Earth element source is aqueous Ca(HCO$_3$)$_2$ and a mixture of RMgBr and RMgCl Grignard reagents in an organic solvent; and said metal plug is comprised of copper.

15. A method of forming a metal plug, comprising the steps of:
  providing an etched dielectric layer over a conductive layer over a semiconductor structure; said etched dielectric layer having a via hole and an exposed periphery;
  treating said etched dielectric layer with at least one Alkaline Earth element source to form an in-situ metal barrier layer within said dielectric layer exposed periphery;
  treating the structure with hydrogen-plasma;
  forming a metal plug within said via hole.

16. The method of claim 15, wherein said in-situ metal barrier layer is from about 1 to 100 Å thick.

17. The method of claim 15, wherein said in-situ metal barrier layer is from about 2 to 30 Å thick.

18. The method of claim 15, wherein said etched dielectric layer is from about 2000 to 10,000 Å thick and said via hole 16 is from about 100 to 10,000 Å wide.

19. The method of claim 15, wherein said etched dielectric layer is from about 4000 to 8000 Å thick and said via hole is from about 1000 to 5000 Å wide.

20. The method of claim 15, wherein said dielectric layer is selected from the group consisting of FSG, PSG, BPSG, and carbon-doped oxide; said conductive layer is formed of a material selected from the group consisting of copper, aluminum, gold, and silver; said at least one Alkaline Earth element source is selected from the group consisting of RMgBr, RMgCl, RMgF, RMgI and RMgAt Grignard reagents in an organic solvent, and a calcium source selected from the group comprising aqueous Ca(HCO$_3$)$_2$ and aqueous Mg(HCO$_3$)$_2$; and said metal plug is comprised of a metal selected from the group consisting of copper, aluminum, gold, and silver.

21. The method of claim 15, wherein said at least one Alkaline Earth element source is aqueous Ca(HCO$_3$)$_2$, and RMgBr and RMgCl Grignard reagents in an organic solvent; and
  whereby said hydrogen-plasma treatment step removes any Br and Cl from said structure.

22. The method of claim 15, wherein said dielectric layer is comprised of FSG; said conductive layer is comprised of copper; said at least one Alkaline Earth element source is aqueous Ca(HCO$_3$)$_2$ and a mixture of RMgBr and RMgCl Grignard reagents in an organic solvent; and said metal plug is comprised of copper.

* * * * *

UNITED STATES PATENT AND TRADEMARK OFFICE
CERTIFICATE OF CORRECTION

PATENT NO. : 6,391,783 B1  
DATED : May 21, 2002  
INVENTOR(S) : John Sudijono, Yakub Aliyu, Mei Sheng Zhou, Simon Chooi, Subhash Gupta, Sudipto Ranendra Roy, Paul Ho and Yi Xu It is certified that error appears in the above-identified patent and that said Letters Patent is hereby corrected as shown below:

<u>Title page,</u>
Item [75], Inventors, please delete "Sudipto Roy", and replace with -- Sudipto Ranendra Roy --.

Signed and Sealed this

Nineteenth Day of November, 2002

Attest:

Attesting Officer

JAMES E. ROGAN
Director of the United States Patent and Trademark Office